United States Patent [19]

Trimble

[11] Patent Number: 5,362,575
[45] Date of Patent: Nov. 8, 1994

[54] LITHOGRAPHIC MASK, COMPRISING A MEMBRANE HAVING IMPROVED STRENGTH

[75] Inventor: Lee E. Trimble, Hillsborough, Somerset County, N.J.

[73] Assignee: AT&T Bell Laboratories, Murray Hill, N.J.

[21] Appl. No.: 999,065

[22] Filed: Dec. 31, 1992

[51] Int. Cl.[5] .............................................. B32B 9/00
[52] U.S. Cl. .................................... 428/688; 428/192; 428/210; 428/702; 428/704; 430/5; 378/35
[58] Field of Search ...................... 430/5, 317; 378/35; 359/629; 428/195, 196, 220, 688, 689, 698, 699, 702, 704, 192, 210

[56] References Cited

U.S. PATENT DOCUMENTS

| | | | |
|---|---|---|---|
| 4,451,544 | 5/1984 | Kawabuchi | 430/5 |
| 4,608,326 | 8/1986 | Neukermans et al. | 430/5 |
| 4,647,517 | 4/1987 | Hersener et al. | 430/5 |
| 4,680,243 | 7/1987 | Shimkunas et al. | 430/5 |
| 4,701,391 | 10/1987 | Lentfer | 430/5 |
| 4,978,421 | 12/1990 | Bassous et al. | 156/645 |
| 5,051,326 | 9/1991 | Celler et al. | 430/5 |
| 5,057,388 | 10/1991 | Yahalom | 430/5 |
| 5,178,977 | 1/1993 | Yamada | 430/5 |

FOREIGN PATENT DOCUMENTS

| | | | |
|---|---|---|---|
| 110635 | 5/1988 | Japan | 430/5 |
| 42711 | 2/1990 | Japan | 430/5 |

OTHER PUBLICATIONS

Elliot, "Integrated Circuit Fabrication Technology" McGraw Hill, 1982 pp. 246-259.

G. K. Celler, et al., "Masks for x-ray lithography with a point source stepper," J Vac. Sci Technol. B 10(6), Nov/Dec 1992, 3186-3190.

L. E. Trimble et al., SPIE Proceedings vol. 1671, Electron-beam, S-ray, and Ion-Beam Submicrometer Lithographies for Manufacturing II, 8-9, Mar. 1992, p. 317.

L. E. Trimble et al., "Evaluation of polycrystalline silicon membranes on fused silica for x-ray lithography masks," J. Vac. Sci. Technol. B7, (1989) 1675-1679.

Primary Examiner—Patrick J. Ryan
Assistant Examiner—Patrick Jewik
Attorney, Agent, or Firm—Martin I. Finston

[57] ABSTRACT

A membrane is supported at its edge by an annular, tapered skirt structure. The skirt strengthens the attachment of the membrane to the support ring and reinforces the edge region where the membrane would otherwise tend to fail. Stress concentrations are reduced by providing a skirt or featheredge, on the interior side of the skirt, that meets the membrane at a relatively small effective contact angle. In a preferred embodiment, the membrane is made by depositing a polysilicon layer on the surface of a substrate of silica-based glass. A portion of the substrate is removed by an isotropic, selective etchant, such that a portion of the polysilicon layer remains as a free-standing, tensile film supported by a remaining portion of the substrate.

7 Claims, 1 Drawing Sheet

LITHOGRAPHIC MASK, COMPRISING A MEMBRANE HAVING IMPROVED STRENGTH

FIELD OF THE INVENTION

This invention relates to free-standing tensile films which are supported at the edges by rigid, annular members. More particularly, this invention relates to films made from polysilicon or other materials of suitable transparency to x-rays for use in x-ray lithographic masks for fabrication of integrated circuits.

ART BACKGROUND

Membranes are widely used as microsensor elements, vacuum windows, and substrates for lithographic masks. In particular, masks formed on membranes are of interest for fabricating integrated electronic devices by x-ray lithography. In such a process, an electronic substrate is coated with a resist material that is sensitive to x radiation, and the material is exposed in a pattern defined by a mask for incident x rays. The mask generally includes a desired pattern of x-ray attenuating material and a substrate for supporting the attenuating material. However, a body of substantial thickness underlying the patterned region may itself unacceptably attenuate the incident x radiation in areas that should be transmissive. Generally, this problem is avoided by depositing the attenuating material on a thin membrane that is supported at its periphery by a thicker, typically ring-shaped, support region. The membrane is typically 0.5-5 $\mu$m thick. Desirably, the membrane is relatively robust; e.g., capable of withstanding, over a 2-$\mu$m thickness and 3-cm diameter, a pressure differential across the membrane of at least 20 kPa.

The search for a robust membrane has been fraught with difficulty. For example, one widely investigated x-ray mask is made by forming a heavily boron-doped surface layer on a silicon wafer. A membrane is then formed by exposing the wafer to a selective etchant that removes relatively undoped silicon much more rapidly than the boron-doped silicon. A support ring is defined by applying an etch-resistant material to a peripheral, annular region on the face of the wafer opposite to the boron-doped face. After etching, the thin, boron-doped layer remains suspended within the annular supporting. The etchant must exhibit high selectivity to avoid substantial thinning of the boron-doped layer. The boron-doped silicon is typically single-crystalline on the silicon substrate. As such, it is susceptible to fracture along its crystallographic planes, and therefore does not generally attain the desired degree of robustness.

A more robust membrane is described in U.S. Pat. No. 5,051,326, issued to G. K. Celler, et al. on Sep. 24, 1991. The membrane described therein is made from polysilicon, and is supported by a silicon-oxide-containing body. To make this membrane, a thin, polysilicon region is formed on the surface of a substrate that comprises a silicon-oxide-containing composition such as silica or a silicate. The substrate material is then removed (except for the support ring) by an isotropic etchant that leaves behind the polysilicon membrane. This membrane has a tensile stress of 0.28 GPa and, because of its polycrystalline nature, is less susceptible to fracture than single-crystalline silicon membranes. However, there is a relatively high contact angle, typically greater than 20°, between the edge of the membrane and the support ring.

If a membrane of excellent quality is rigidly supported, it will tend to fail at the periphery, where it is attached to the support ring. When the membrane flexes in response, e.g., to a pressure differential, stress will concentrate in this region. The smaller the bend radius is at the edge of the membrane, the greater will be the stress concentration and the tendency to fail. Flexure of membranes occurs during processing as well as routine handling. The consequent tendency of the membrane to fail decreases manufacturing yield and reduces reliability. Improvements such as that described in the above-cited patent have led to increased material strength of the membranes, but have hitherto failed to address the mechanical problem of stress concentration at the membrane edge.

SUMMARY OF THE INVENTION

The invention, in one aspect, involves a membrane supported at its edge by an annular, tapered structure, referred to hereafter as a "skirt". The skirt strengthens the attachment of the membrane to the support ring and reinforces the edge region where the membrane would otherwise tend to fail. Stress concentrations are reduced by providing a gradual thinning of the support, such as a featheredge or a step on the interior side of the skirt. As a result of the featheredge or step, the membrane meets the skirt at an effective contact angle that is relatively small, i.e., less than about 10°, and in some cases as small as 1°-3°.

Although the invention is particularly useful with regard to x-ray lithographic masks, it is also more generally useful in connection with various types of membranes having, e.g., a diameter at least 1000 times the membrane thickness.

In a preferred embodiment, the membrane is made by depositing a polysilicon layer on the surface of a substrate of silica-based glass. A portion of the substrate is removed by an isotropic, selective etchant, such that a portion of the polysilicon layer remains as a flee-standing, tensile film supported by a remaining portion of the substrate. The etchant comprises water, hydrofluoric acid, and, optionally, sulfuric acid. While it is being etched, the substrate is rotated about an axis perpendicular to the substrate surface.

In another aspect, the invention involves a method for etching aluminosilicate glass, comprising the steps of preparing an aqueous solution of hydrofluoric acid, and exposing a glass surface to the solution. In contrast to methods of the prior art, the preparation step comprises including, in the solution, an amount of sulfuric acid sufficient to prevent substantial amounts of precipitated aluminum fluoride and calcium fluoride from accumulating on the glass surface during the exposing step.

DETAILED DESCRIPTION OF A PREFERRED EMBODIMENT

Figure 1:
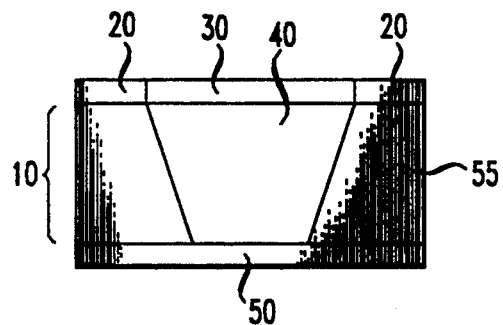
FIG. 1 is a schematic diagram of a membrane and support ring according to the invention in one embodiment.

With reference to FIG. 1, a preferred substrate is a silica-based glass wafer 10, exemplarily a wafer of aluminosilicate glass such as HOYA LE glass. An exemplary wafer is 0.4 mm thick and 76 mm in diameter. (Substrates will generally be at least about 100 μm thick in order to impart sufficient rigidity, and will typically be substantially thicker.) According to a currently preferred method of polysilicon film formation, amorphous silicon is first deposited on both the front and back wafer surfaces by low pressure chemical vapor deposition (LPCVD). For example, amorphous silicon films 1-2 μm thick are readily deposited by decomposition of pure silane at a temperature of 560° C.-570° C. and a pressure of 27 Pa. The films are annealed at the deposition temperature to convert the amorphous silicon to polysilicon. The resulting polysilicon film 20 on the back surface of the wafer is then patterned, exemplarily by reactive ion etching (RIE) through a shadow mask using nitrogen trifluoride gas. The RIE step removes a circular portion 30 of the polysilicon layer, 27 mm in diameter, and leaves behind a concentric, annular portion of the polysilicon layer. The substrate is then etched in an aqueous solution containing hydrofluoric acid. The annular polysilicon portion protects the underlying substrate portion from the etchant, and in that way it defines the support ring 55. The substrate portion 40 in the central, circular region is etched away, exposing the polysilicon film 50 on the front surface of the wafer as a free-standing membrane.

In order to avoid substantial removal of polysilicon membrane material along with the substrate material, the etchant must be selective; that is, it must remove substrate material much more rapidly than it removes polysilicon. In order to form the desired skirt structure, the etchant must also remove substrate material isotropically. Aqueous hydrofluoric acid etchant solution satisfies these requirements when a silica-based, glass substrate is to be etched. However, when aluminosilicate glass is etched by hydrofluoric acid, an insoluble etch product tends to coat the etch surface, impeding the further removal of material by etching. When a typical aluminosilicate glass substrate is etched, the composition of this etch product includes aluminum fluoride and calcium fluoride. Rotation of the substrate has not proven effective for removing this etch product.

This problem is solved by adding sulfuric acid to the etchant solution. In the resulting etchant solution, the etch product appears to be transported away from the substrate surface before it is precipitated. An effective etchant composition, for etching at 40° C., comprises, by volume, 10 parts water, 1 part concentrated (49%) hydrofluoric acid, and one pan concentrated (97%) sulfuric acid.

In order to form the desired skirt structure, it is also necessary to rotate the substrate while it is being etched. This rotation reduces the contact angle between the support ring and the membrane, and produces the desired, uniform, featheredged skirt shape. According to my current belief, the rotation causes a radially uniform, etch-rate gradient, which produces these desired results.

The substrate is rotated about an axis perpendicular to the substrate surface at a rate of 0.1-100 revolutions per minute (rpm), and typically at a rate of about 0.33 rpm. The rotation affects the formation of the skirt structure, as noted, and also prevents the formation of sharp edges in the skirt, which would otherwise form due to non-uniform etching. These sharp edges are undesirable because they can behave as stress concentrators, and thus lead to failure of the membrane.

Figure 2:
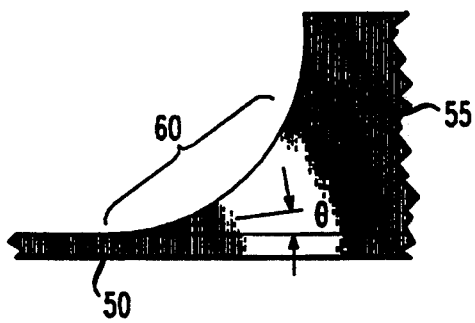
FIG. 2 is a detail of the membrane and support ring of FIG. 1, showing a featheredged skirt.

As a result of the above-described etching process, a skirt 60 of substrate material is produced, as shown in FIG. 2. In effect, this skirt gradually thickens the membrane at its periphery, thereby creating a smooth transition from the flexible membrane to the rigid support ring. This configuration, referred to herein as a "featheredge", decreases stress concentration by increasing the bend radius that results at the edge of the membrane when the membrane is flexed. A contact angle $\theta$ less than about 10°, and typically 3° or less, is formed at the edge of the membrane where the membrane meets the skirt.

EXAMPLE I

A group of skirted polysilicon membranes on glass support rings were made substantially as described above. The membranes were all 1-2 μm thick. The strength of the membranes was tested in a conventional bulge test, in which the membrane is stretched against its rigid support. These tests are hereafter referred to as "RC tests". (RC stands for "rigid contact".) RC test methods are described in L. E. Trimble et al., *SPIE Proceedings* Vol. 1671, Electron-beam, X-ray, and Ion-Beam Submicrometer Lithographies for Manufacturing II, 8-9 March 1992, p. 317. Briefly, in an RC test, the membrane deflection is measured as the pressure differential across the membrane is increased incrementally until the membrane fractures. The deflection is measured by observing the height of the bulge at the center of the membrane with an optical, Normarski-contrast microscope. The fracture strength is readily calculated from the membrane dimensions and the pressure and deflection at the time of fracture. The elastic modulus and residual stress are also readily calculated from the relation between pressure and deflection.

The elastic modulus of the tested membranes was 180±10 GPa, and the residual stress was 270±10 MPa. The average strength of the membranes was 1.5 GPa. Significantly, this average strength was found to be about three times the average RC strength, 0.56 GPa, of $SiN_x$ membranes conventionally made on silicon substrates by anisotropic etching. This strength was also significantly higher than the strength, 1.08 GPa, of polysilicon membranes formed on glass substrates without skirts.

Figure 3:
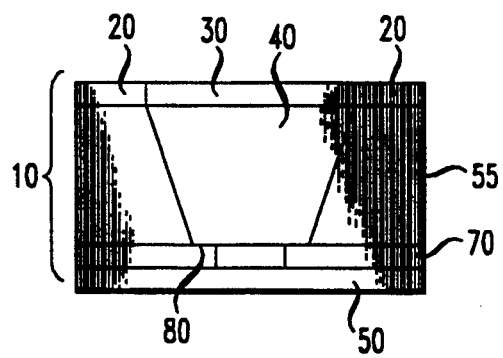
FIG. 3 is a schematic diagram of a membrane and support ring according to an alternate embodiment of the invention, which includes a step skirt.
Figure 4:
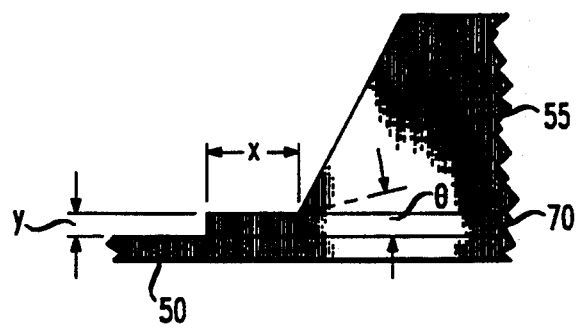
FIG. 4 is a detail of the step skirt of FIG. 3, illustrating the effective contact angle.

With reference to FIGS. 3 and 4, one alternative to a featheredged skirt is a step skirt made by depositing one or more additional layers 70 intermediate the membrane layer and the front surface of the substrate. These additional layers are etched away from the effective area of the membrane, but an annular shoulder region 80 is left behind, which, in effect, thickens the membrane near its attachment to the support ring. This thickened portion, including the shoulder region, is referred to herein as a step skirt. The step skirt can be made with one or more steps, each step corresponding to one of these additional layers. In a cross-sectional view of the membrane and support ring, an effective contact angle is conveniently defined by drawing a line through the outer edge of the shoulder (i.e., the point where it meets the support ring), and the inner edge of the shoulder. The effective contact angle $\theta$ is defined between this line and the surface of the membrane; i.e., $$\theta = \arctan\frac{y}{x},$$

where the distances x and y are as shown in FIG. 4. In, e.g., a skirt having a single step, this angle will be less than 10° if the width of the shoulder is at least about 6 times the thickness of the additional layer.

In an exemplary fabrication procedure, a double layer of silicon nitride is deposited on the front surface of a silicon wafer. Each layer is about 1-μm thick. The support ring is formed by etching through the silicon wafer from the back, as described above. This exposes the silicon nitride layer nearest the substrate, referred to herein as the "step" layer. A photoresist is applied to the step layer and lithographically patterned to form a mask over an annular portion of the step layer which extends inward by, e.g., 0.5 mm from the inner edge of the support ring. The unmasked portion of the step layer is then removed by reactive ion etching, and the developed photoresist is removed. As a general rule, the width of the stepped skirt should be great enough to permit it to flex when the membrane is flexed. Thus, the width of the stepped skirt should generally be at least 10 times the membrane thickness, although in some cases a narrower skirt may be acceptable.

Figure 5:
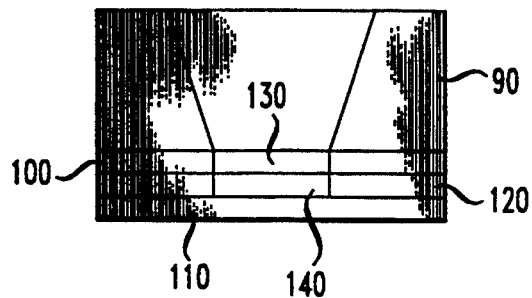
FIGS. 5 and 6 are schematic diagrams illustrating some of the steps in the fabrication of a membrane having a step skirt, according to the invention in one embodiment.
Figure 6:
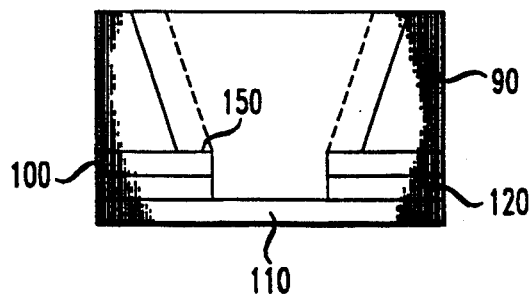

In an alternate fabrication procedure, illustrated in FIGS. 5 and 6, an aluminosilicate glass substrate 90 is substituted for the silicon substrate, and 1-μm polysilicon layers 100 and 110 are substituted for the silicon nitride layers. A thin silicon dioxide separating layer 120, 140 is formed, by thermal oxidation or by deposition, between the polysilicon layers. This layer can be as thin as about 50 Å. The substrate is subjected to a liquid hydrofluoric acid etch, which stops at the polysilicon step layer 100. The portion 130 of the step layer that is not overlain by the substrate is then removed by an etch in EDP. A second liquid hydrofluoric acid etch then removes the exposed portion 140 of the separating layer, and also laterally cuts back the inner, annular face of the substrate by a distance equal to about 10 times the membrane thickness. This removal of substrate material exposes a shelf-like portion 150 of the step layer, thus forming a step skirt. This method is advantageous because no lithographic patterning step is required.

EXAMPLE II

Silicon nitride membranes with step skirts were made on silicon substrates, as described above. The total membrane diameter was 27 mm. For comparison, unskirted membranes of the same, single thickness, and unskirted membranes of double thickness were also made. The skirted membranes exhibited an average bursting strength of 0.90 GPa. The corresponding value for the unskirted, single-thickness membranes was 0.53 GPa, and for the unskirted, double-thickness membranes it was 0.89 GPa.

I claim:

1. An article comprising a perforate body having a principal surface and a thickness measured perpendicularly to the principal surface; and an imperforate, solid layer overlying the principal surface, wherein:
   a) in at least a portion of the perforate body, the thickness is at least about 100 μm;
   b) the perforate body has an inner surface such that the: the inner surface defines a hole, and the inner surface forms an effective contact angle with the imperforate, solid layer;
   c) the imperforate, solid layer overlies the hole;
   d) the imperforate, solid layer has a thickness of about 5 μm or less; and
   e) that portion of the imperforate, solid layer that overlies the hole, such portion to be referred to as a membrane, has a diameter of at least about 1000 times the imperforate, solid layer thickness;
   f) the article further comprises a skirt region intermediate the imperforate, solid layer and the hole, the skirt region providing an effective contact angle of about 10° or less;
   g) the perforate body comprises silica-containing glass; and
   h) the imperforate, solid layer comprises silicon.

2. The article of claim 1, wherein:
   a) the inner surface intersects the principal surface, whereby a circumferential edge is defined;
   b) the skirt region comprises a portion of the perforate body adjacent the circumferential edge;
   c) in the skirt region, the inner surface is concave; and
   d) a portion of the skirt region adjacent the circumferential edge has a thickness smaller than the thickness of the imperforate, solid layer.

3. The article of claim 2, wherein the effective contact angle is 3° or less.

4. The article of claim 2, wherein the perforate body comprises aluminosilicate glass, and the imperforate, solid layer comprises polysilicon.

5. An article comprising a perforate body having a principal surface and a thickness measured perpendicularly to the principal surface; an imperforate and solid first layer overlying the principal surface; and a perforate and solid second layer intermediate the perforate body and the first layer, wherein:
   a) in at least a portion of the perforate body, the thickness of said body is at least about 100 μm;
   b) the perforate body has an inner surface such that: the inner surface defines a hole, and the inner surface forms an effective contact angle with the first layer;
   c) the first layer overlies the hole;
   d) the first layer has a thickness of about 5 μm or less;
   e) that portion of the first layer that overlies the hole, such portion to be referred to as a membrane, has a diameter at least about 1000 times the first layer thickness;
   f) the article further comprises a skirt region intermediate the first layer and the hole, the skirt region providing an effective contact angle of about 10° or less;
   g) the second layer has a thickness to be referred to as y, said thickness approximately equal to the first layer thickness;
   h) the skirt region comprises a shelf-shaped portion of the second layer which projects a distance over the hole, said distance to be referred to as x;
   i) x is at least about 6y but not more than about 60y; and
   j) the effective contact angle is defined by $$\arctan\frac{y}{x}.$$

6. The article of claim 5, wherein the perforate body comprises silicon, the first layer comprises silicon nitride, and the second layer comprises silicon nitride.

7. The article of claim 5, wherein the perforate body comprises aluminosilicate glass, the second layer comprises polysilicon and the first layer comprises polysilicon.

* * * * *